United States Patent [19]

Dykstra et al.

[11] Patent Number: 4,929,840
[45] Date of Patent: May 29, 1990

[54] WAFER ROTATION CONTROL FOR AN ION IMPLANTER

[75] Inventors: Jerald P. Dykstra; Andrew M. Ray, both of Austin, Tex.

[73] Assignee: Eaton Corporation, Cleveland, Ohio

[21] Appl. No.: 317,226

[22] Filed: Feb. 28, 1989

[51] Int. Cl.$^5$ .............................................. H01J 37/08
[52] U.S. Cl. .................................. 250/492.3; 250/397; 250/398
[58] Field of Search ................. 250/398, 492.2, 492.21, 250/397

[56] References Cited

U.S. PATENT DOCUMENTS

| | | | |
|---|---|---|---|
| 4,110,625 | 8/1978 | Cairns et al. | 250/492.21 |
| 4,517,465 | 5/1985 | Gault et al. | 250/492.21 |
| 4,743,767 | 5/1988 | Plumb et al. | 250/398 |
| 4,745,287 | 5/1988 | Turner | 250/492.2 |
| 4,794,305 | 12/1988 | Matsukawa | 250/492.21 |
| 4,849,641 | 7/1989 | Berkowitz | 250/492.2 |

FOREIGN PATENT DOCUMENTS 68281248 12/1987 Japan .

OTHER PUBLICATIONS

Improved VLSI Device Yields Through Control of Implant Angle by R. E. Kaim and J. F. M. Westendorp.
Analysis of Uniformity of Trench Side-Wall Doping by SIMS by T. Takemoto, Y. Hirofuji, H. Iwasaki, N. Matsuo.
A New Isolation Method with Boron-Implanted Sidewalls for Controlling Narrow-Width effect by G. Fuse, M. Fukumoto, A. Shinohara, S. Odanaka, M. Sasago, T. Ohzone.
The Application of Self-Spinning Ion Implantation to VLSI Devices, Nissin Electric Company, Ltd.
New End Station for Rotation/Wide-Angle Ion Implanter Technique and its Application to VLSI Devices, Nissin Electric Company, Ltd.

Primary Examiner—Bruce C. Anderson
Attorney, Agent, or Firm—F. M. Sajovec

[57] ABSTRACT

A method and apparatus for controlling the ion dose implanted in a semiconductor wafer. The wafer is received on a platen which is rotated in discrete steps by a stepper motor. With the wafer in an initial stationary position the dose accumulated by the wafer is measured. When the incremental measured dose equals the total dose to be implanted divided by a predetermined number of steps over which the implant is to be carried out, the motor is stepped one increment. This process is then repeated until the total desired dose is attained.

6 Claims, 5 Drawing Sheets

WAFER ROTATION CONTROL FOR AN ION IMPLANTER

The present invention relates generally to ion implantation equipment and more particularly to an improved control system for an ion implanter.

Ion implanters are well known in the art. U.S. Pat. No. 4,761,559 to Myron, and assigned to the assignee herein, depicts a typical ion implanter incorporating an end station wherein semiconductor wafers are transported serially into the end station vacuum chamber, clamPed to a platen, rotated into a fixed implant position, and then implanted while held rigidly in the fixed position. Typically, this fixed position is at a predetermined angle of incidence, generally 7°, to avoid channeling effects.

There has recently been developed a need for improved versatility in ion implanter operation, specifically the ability to implant wafers at variable implant angles substantially higher than the typical 7° angle, and the ability to rotate the wafer during implantation. Some of the applications which require such versatility are large Angle Tilt Implanted Drain (LATID) transistors, trench capacitor sidewall for Dynamic Ram, Lightly Doped Drain (LDD) symmetry enhancement, channel stop trench sidewall implant, improved sheet resistance uniformity, and the reduction of shadowing effects from high aspect ratio masks. It is expected that other applications will become evident as the capability for performing these operations is incorporated in implanter designs.

To satisfy the above needs an ion implanter has been developed incorporating an end station which will enable wafers to be implanted at various implant angles, including angles of at least 60°, and which provides the capability for rotating the wafer during or between implants. This includes rotating the wafer continuously during implantation; as well as implanting the wafer at a given dose, rotating the wafer through a predetermined angle and then repeating the cycle one or more times.

It is an object of the present invention to provide a system for controlling the rotation of wafers in the above type of end station.

To meet the above objective the present invention provides a stePper motor to rotate the wafer-receiving platen about the wafer axis and a system for controlling the stepper motor whereby the wafer is rotated in a number of discrete steps which can be on the order of 1/100 degree. This effectively provides continuous rotation; however, each step is controlled in relation to the beam current as measured by a Faraday Cup to insure a uniform dose distribution as a function of angular rotation. If the beam current fluctuates during implant, the wafer rotation rate will fluctuate accordingly since each rotation step is in effect "clocked" by the measured dose increment. If, for any reason, the beam is lost the rotation will stop until the beam is restored, thus maintaining uniformity even under a condition which heretofore would have resulted in an improperly implanted wafer.

Other objectives and advantages of the invention will be apparent from the following description when considered in connection with the accompanying drawings, wherein.

Figure 1:
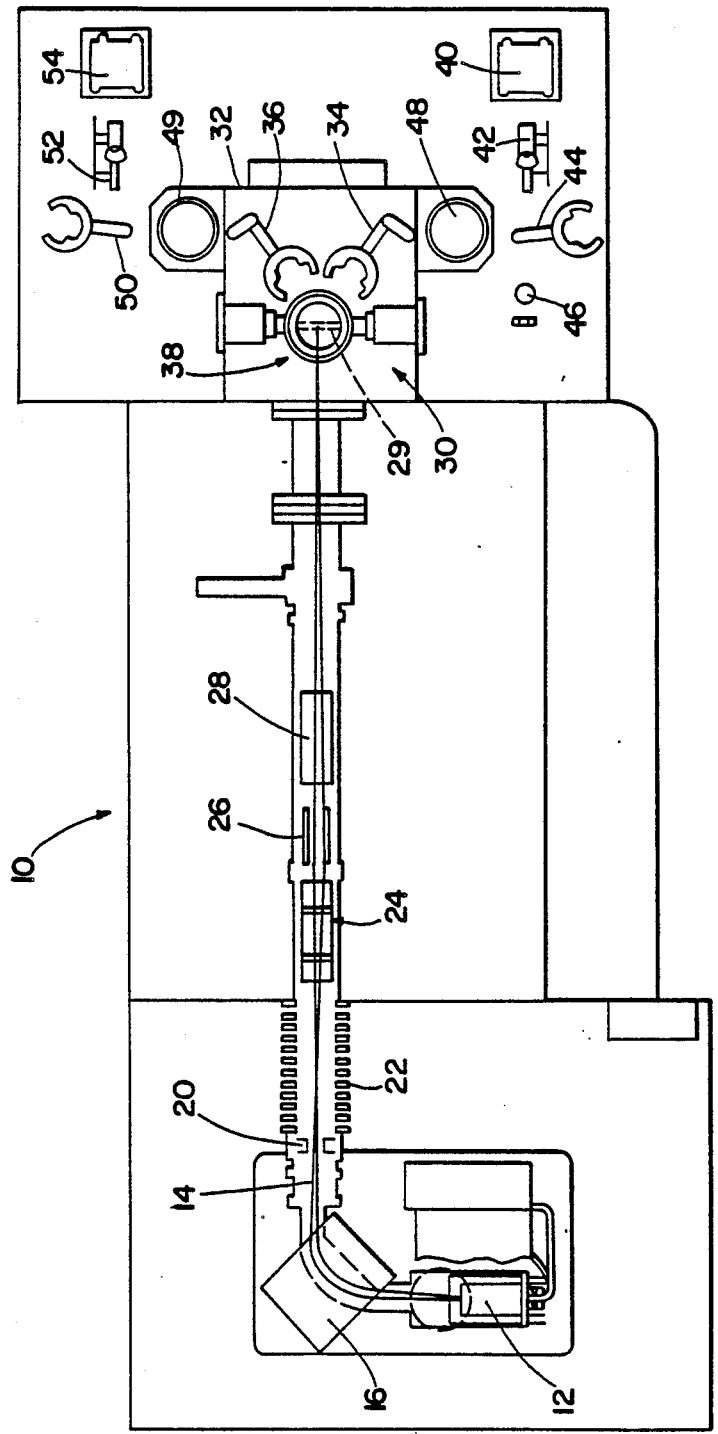
FIG. 1 is a schematic plan view of an ion implanter incorporating the invention.

Referring to FIG. 1, there is illustrated an ion implanter 10 with which the present invention can be used. The implanter includes an ion source 12 for directing an ion beam 14 to an analyzing magnet 16 which bends the beam and directs it along an elongated travel path through a beam shutter 20 and accelerating electrodes 22. Subsequent to the electrodes 22, the beam passes through a quadrupole lens system 24 that focuses the beam, and then through deflection electrodes 26 and 28 wherein control voltages deflect the beam from side to side and up and down, the modulation of such control voltages causing the beam to be scanned across a wafer 29 positioned in an end station 30.

The end station 30 is located in an evacuated chamber 32. Two arms 34 and 36 mounted within the chamber 32 automatically load and unload wafers to and from a wafer support assembly 38. Undoped wafers are retrieved from a cassette 40 by a shuttle 42 which brings a wafer to the vicinity of an arm 44 which moves the wafer to an orienter 46, when the wafer is rotated to a particular crystal orientation. The arm 44 retrieves the oriented wafer and moves it into a loading station 48 adjacent the chamber 32. The loading station 48 closes, is pumped down to a desired vacuum, and then opens into the chamber 32. The arm 34 then grasps the wafer, brings it within the chamber and places it on the support 38 in position for further handling and implantation as will be described in further detail below.

On the unload side of the chamber 32 the second arm 36 grasps an implanted wafer 29 from the support and moves it from the chamber to an unload station 49. From the unload station an arm 50 moves the wafer to a shuttle 52 which automatically places the wafer into a second cassette 54.

Figure 2:
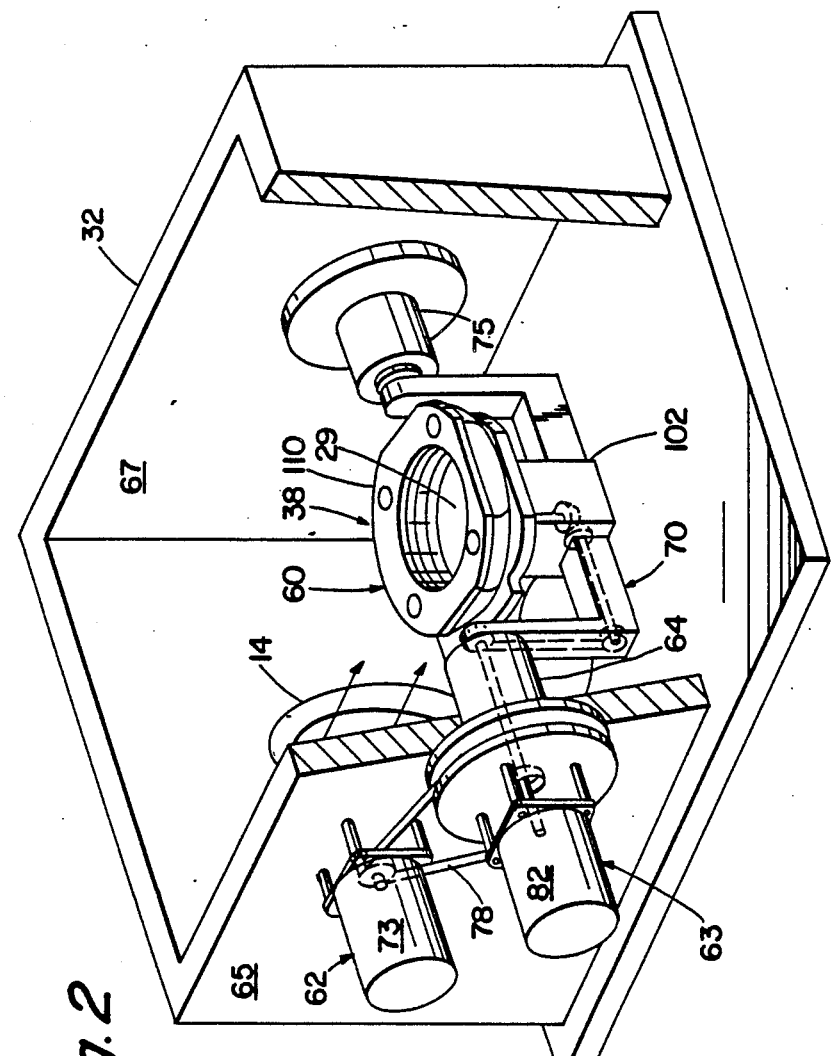
FIG. 2 is a schematic oblique view of the end station of the implanter shown in FIG. 1.
Figure 3:
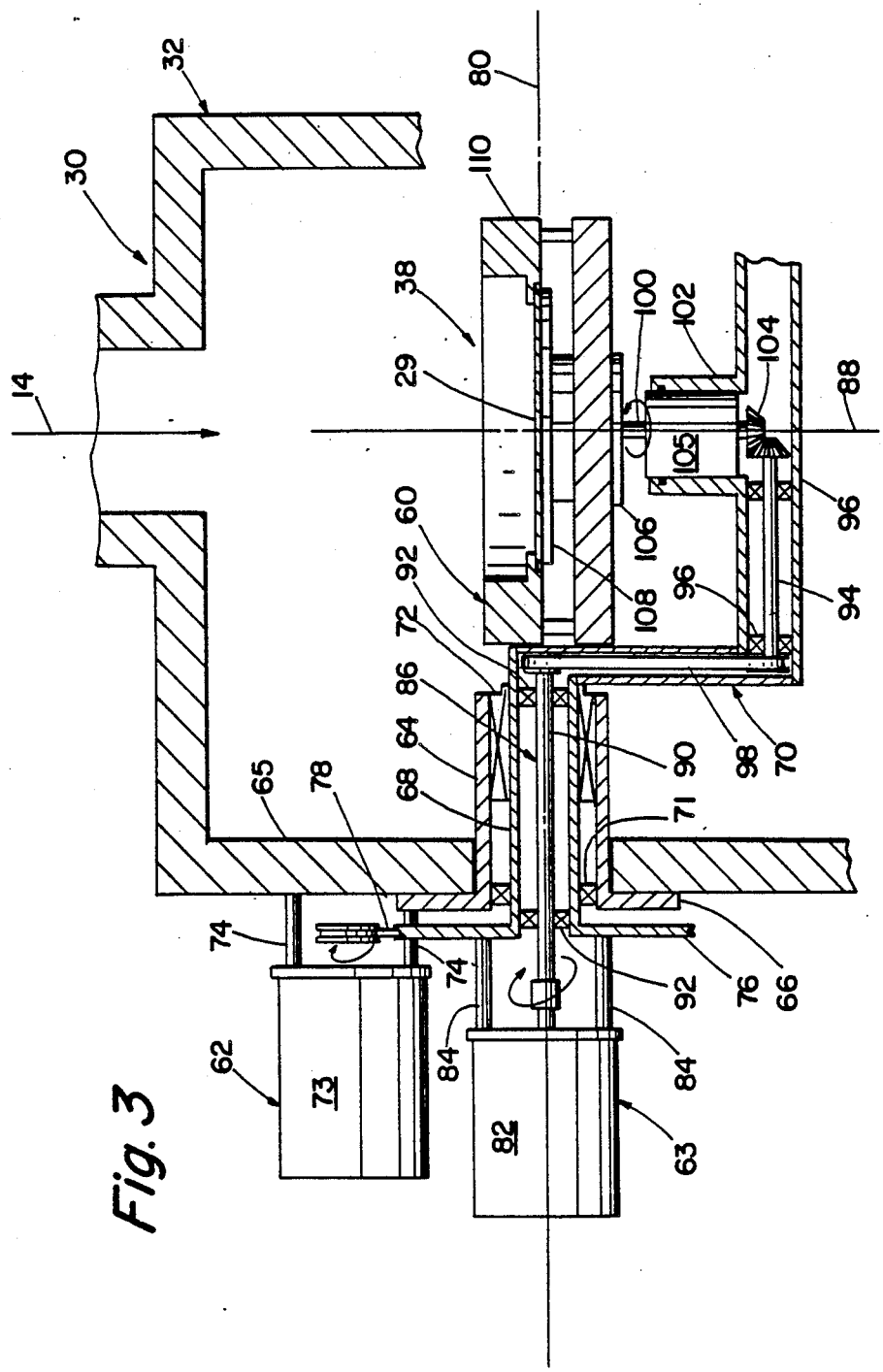
FIG. 3 is a schematic section view of the end station.

Referring particularly to FIGS. 2 and 3, the improved end station of the present invention includes a rotating and tilting wafer suPport assembly 38 located within the vacuum chamber 32, a wafer tilt drive assembly 62 located outside the vacuum chamber, and a wafer rotation drive system 63, also located outside the vacuum chamber.

The wafer support assembly 38 comprises a first cylindrical housing 64 which protrudes through a wall 65 of the vacuum chamber and is fixed thereto by means of a flange 66, a second cylindrical housing 68 supported for rotation within the first housing and including a generally U-shaped portion 70, and a platen assembly 60 mounted on the U-shaped portion. The housing 68 is supported by a first bearing 71 and by a combined bearing and seal assembly 72 which is preferably of a type referred to as a Ferrofluidic (registered trademark of Ferrofluidics Corp.). Referring to FIG. 2, the opposite leg of the U-shaPed Portion is supported by a bearing assembly 75 attached to a wall 67 of the vacuum chamber.

The tilt drive assembly 62 comprises a first stepper motor 73 which is mounted on the chamber 32 by means of stand-offs 74, and an enlarged drive sheave 76 which is formed as an extension of the inner cylindrical housing 68. The motor 73 is operable, though a drive belt 78, to rotate the housing and thus the platen assembly 60 about an axis 80 which extends substantially through the plane defined by the surface of a wafer 29 on the support.

The rotation drive system 63 comprises a second stepper motor 82 mounted on the outer face of the sheave 76 by means of stand-offs 84, and a transfer system 86 which is operable to rotate the platen assembly about an axis 88 normal to the wafer surface and through its center.

The transfer system 86 comprises a first shaft 90 coupled to the output shaft of the motor 82 and supported within the housing 68 on bearings 92, a second shaft 94 received within the base of the U-shaped portion 70 and supported on bearings 96, a sheave and belt system 98 connecting the first and second shafts, a third shaft 100 fixed to the platen assembly 60 and mounted for rotation within a hub 102 extending inwardly from the base of the U-shaped portion, and a bevel gear system 104 connecting the second and third shafts. The shaft 100 is supported within the hub by a combined bearing and seal assembly 105 which is also of the Ferrofluidic type.

The platen assembly 60 comprises a base member 106 fixed to the shaft 100, a wafer-receiving platen 108 mounted on the base, and a spring-loaded clamp assembly 110 mounted on the base and operable to selectively hold the wafer in contact with the platen. Such platens and clamp assemblies are well known in the art and will not be described herein in detail.

In operation, a wafer 29 is removed from cassette 40 by the shuttle 42, moved first to the orienter 46 and then to the loading station 48 by arm 44. After proper evacuation procedures between the loading station 48 and the vacuum chamber 32, the load arm 34 transfers the wafer from the load station to the load support 38 where it is clamPed to the platen 108 by the clamp assembly 110. The tilt drive motor 73 is then energized to rotate the wafer support about axis 80 from the horizontal position shown in FIG. 2 to an implant position, which can typically be anywhere between the position of FIG. 3 wherein the axis 88 is parallel to the beam axis, and a position wherein the axis 88 is rotated 60° from the beam axis. Once in the desired implant position, the wafer 29 can be irradiated by the beam 14 in a fixed angular position, or it can be rotated continuously, or it can be rotated in discrete steps, depending on the requirements of the particular implant.

Upon completion of the implantation the wafer is transferred first to the unload station 49 by the arm 36, and then to the cassette 54 by the arm 50 and the shuttle 52.

Figure 4:
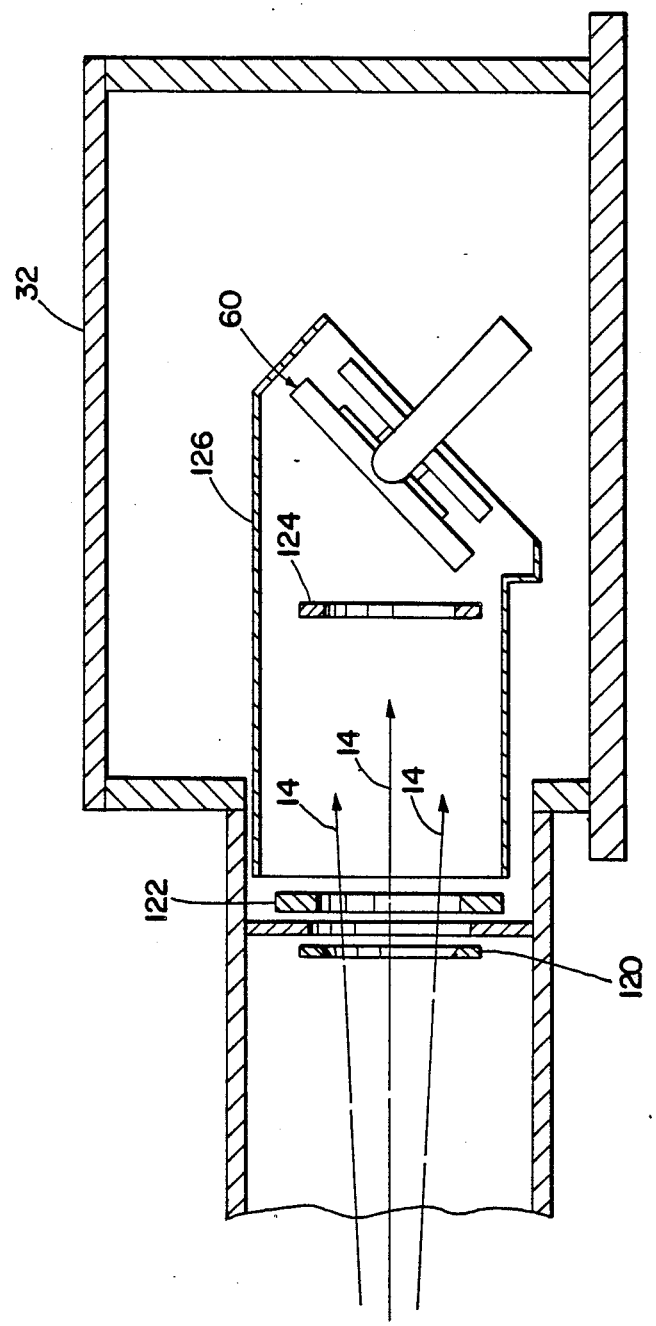
FIG. 4 is a schematic section view of the beamline end of the end station.

Referring to FIG. 4, there is illustrated a schematic representation of the beamline of the implanter 10, including the vacuum chamber 32, a beam defining aperture 120, an election suppression electrode 122 downstream of the aperture 120, an electron flood ring 124 adjacent the platen assembly 60, and a Faraday cup 126 encircling the components downstream of the suppression electrode. As is well known in the art all the charge that passes through the defining aperture is collected by the Faraday Cup and measured for computing the dose of ions implanted into the wafer 29, the amount of charge collected by the Faraday Cup divided by the area of the wafer yielding the charge per unit area or dose that the wafer acquires as the result of the implant.

Figure 5:
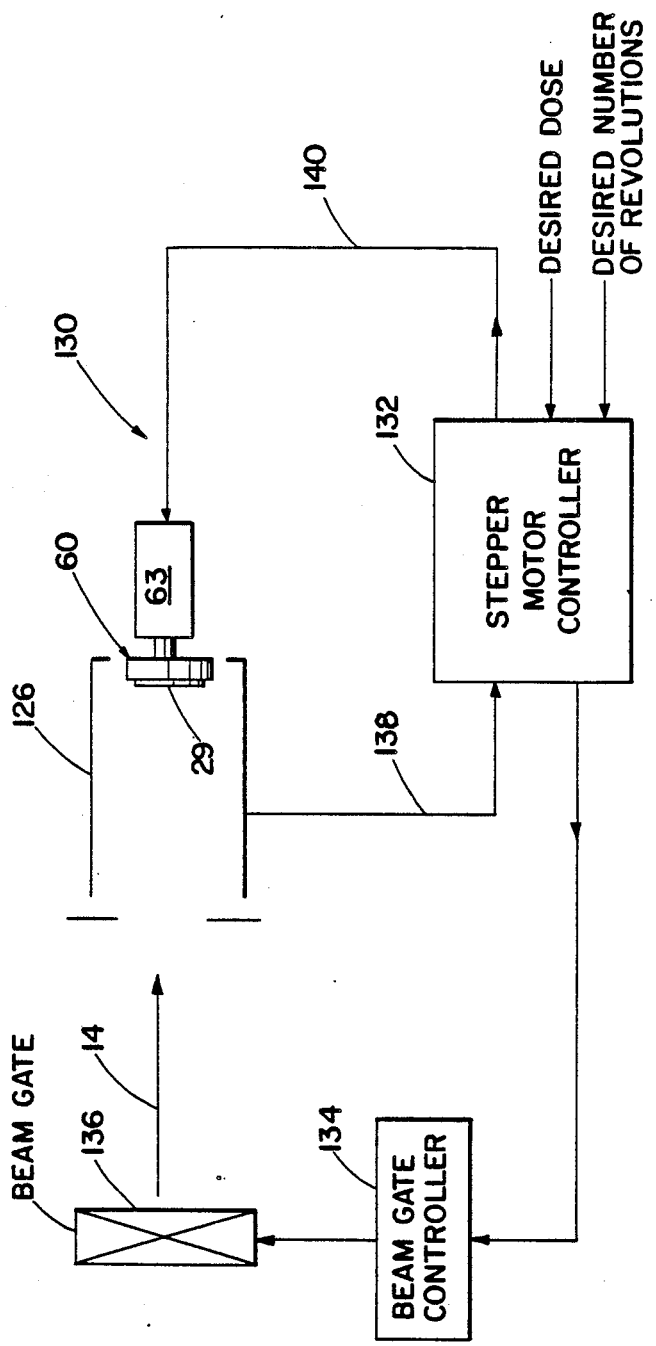
FIG. 5 is a schematic diagram of the control system of the invention.

Referring to FIG. 5, there is schematically illustrated a system 130 for controlling the rotation of the wafer to achieve a uniform dose across the surface of the wafer. In operation, the desired total dose and the desired number of revolutions of the platen assembly 60 are input into a stepper motor controller 132 where the desired dose is divided by the total number of steps of the implant to determine the dose to be implanted per motor step. Thus, if a motor which makes 1 degree steps is used, and it is desired to complete the implant in one revolution, the total dose desired divided by 360 will yield the dose per step. The platen assembly is initially positioned at a desired starting point, and the beam 14 is gated on by means of a signal from the controller 132 to a gate controller 134, which then provides an "on" signal to the beam gate 136 to start the implant. In the ion implanter illustrated in FIG. 1, the beam gate is in the form of a shutter which is placed in the Path of the beam to block the flow of ions to the wafer. It can be appreciated that the beam gate can also be in the form of apparatus which redirects the beam to a beam dump plate or to another end station, or other means to interrupt the beam of ions which is received by the wafer. As the implant progresses, the accumulated ion dose is collected by the Faraday Cup 126 which provides a beam current signal indicative of the accumulated dose to the controller 132 via line 138. When the incremental accumulated dose equals the calculated dose per step a signal is sent via line 140 to the stepper motor 63 to rotate the wafer one step. The implant proceeds in this manner until the accumulated dose equals the desired total dose, at which time the implant will be complete and the beam is gated "off" by means of a signal to the gate controller.

We claim:

1. In an ion implanter comprising a vacuum chamber, wafer-receiving support means within said vacuum chamber, means for directing a beam of ions onto a wafer received on said support means, said support means maintaining said wafer in position to continuously intercept said beam of ions, and means for rotating said support means in discrete steps about an axis coinciding with an axis normal to and intersecting the surface of a wafer received on said support means; means for controlling the dose implanted in said wafer comprising means for measuring the dose of ions implanted in a wafer received on said support means, means for interrupting the beam of ions received by the wafer, and control means operable to receive dose information signals from said dose measuring means and to transmit signals to said rotating means to provide stepwise rotation of said support means in response to said dose information signals.

2. Apparatus as claimed in claim 1, in which said means for rotating said support means comprises a stepper motor.

3. Apparatus as claimed in claim 2, in which said means for measuring the dose of ions comprises a Faraday cup.

4. Apparatus as claimed in claim 1, in which said means for interrupting the beam of ions received by the wafer comprises gating means operable to gate the beam on and off, and including a gate controller controlling said gating means, said control means being operable to transmit a signal to said gate controller for gating off said ion beam in response to the receipt of a predetermined accumulated dose signal.

5. A method for controlling the ion dose received by a semiconductor wafer undergoing implantation by an ion beam, comprising the steps of selecting a desired accumulated dose of ions to be implanted in the wafer, providing means for rotating said wafer in discrete steps about an axis normal to and intersecting the surface of the wafer while maintaining said wafer in position to continuously intercept said ion beam, measuring the dose received by the wafer, rotating said wafer one step when the incremental measured dose is equal to the desired accumulated dose divided by a predetermined number of steps, continuing the dose measurement and repeating the rotating steps until said desired accumulated dose is attained.

6. A method as claimed in claim 5 including the steps of gating said ion beam on to start an implant cycle, and gating said ion beam off when the desired accumulated dose is attained.

* * * * *